United States Patent
Tsuchida

(10) Patent No.: US 6,807,088 B2
(45) Date of Patent: Oct. 19, 2004

(54) MAGNETIC RANDOM ACCESS MEMORY AND READING METHOD THEREOF

(75) Inventor: Kenji Tsuchida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/423,936

(22) Filed: Apr. 28, 2003

(65) Prior Publication Data

US 2004/0160811 A1 Aug. 19, 2004

(30) Foreign Application Priority Data

Feb. 17, 2003 (JP) .................................... 2003-038723

(51) Int. Cl.$^7$ .............................. G11C 11/00; G11C 7/00
(52) U.S. Cl. ............. 365/158; 365/189.07; 365/189.05
(58) Field of Search ................................. 365/158, 210, 365/230.06, 189.05, 206, 189.07, 196, 189.04, 189.09, 207

(56) References Cited

U.S. PATENT DOCUMENTS

| | | | | |
|---|---|---|---|---|
| 5,852,574 A | * | 12/1998 | Naji | ........................... 365/158 |
| 6,134,138 A | | 10/2000 | Lu et al. | |
| 6,349,054 B1 | | 2/2002 | Hidaka | |
| 6,501,697 B1 | * | 12/2002 | Perner et al. | ................ 365/209 |
| 2002/0008987 A1 | | 1/2002 | Numata et al. | |
| 2002/0057593 A1 | | 5/2002 | Hidaka | |

* cited by examiner

Primary Examiner—Thong Q. Le
(74) Attorney, Agent, or Firm—Oblon, Spivak, McClelland, Maier & Neustadt, P.C.

(57) ABSTRACT

Reference cells are provided in a memory cell array. When the data is read, the data in the reference cells are inverted, thereby preventing the data in the selected cell from changing. This makes it possible to decrease the number of write operations and realize a high-speed read operation and lower power consumption.

22 Claims, 8 Drawing Sheets

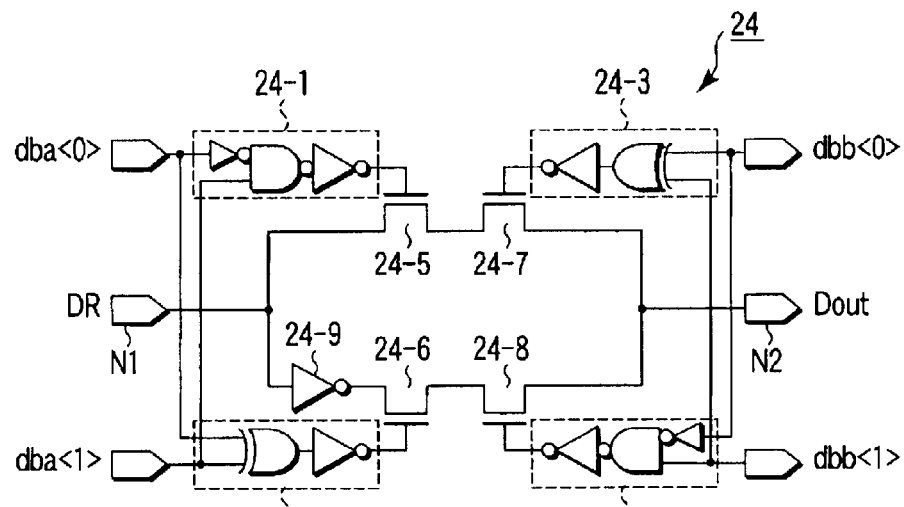
FIG. 8
FIG. 9
| Initial data in reference cell (data register) | 0 | | 1 | |
|---|---|---|---|---|
| dba<0><1> | 0,1 | 1,1 | 0,1 | 0,0 |
| dbb<0><1> | 0,0 | 0,1 | 1,1 | 0,1 |
| Dout | 0 | 1 | 1 | 0 |
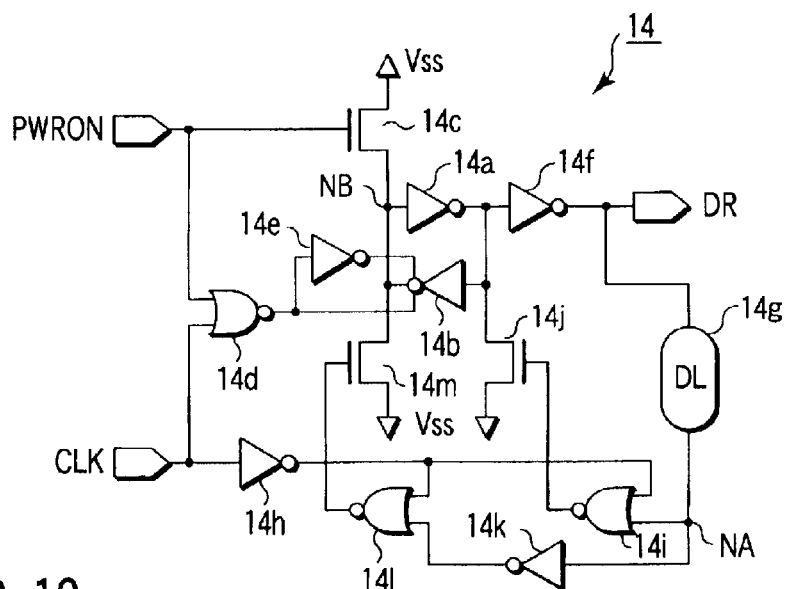
FIG. 10

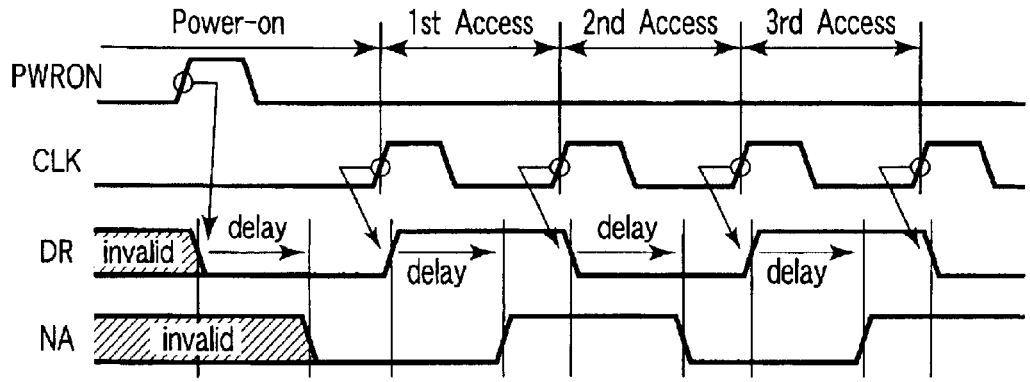
F I G. 11
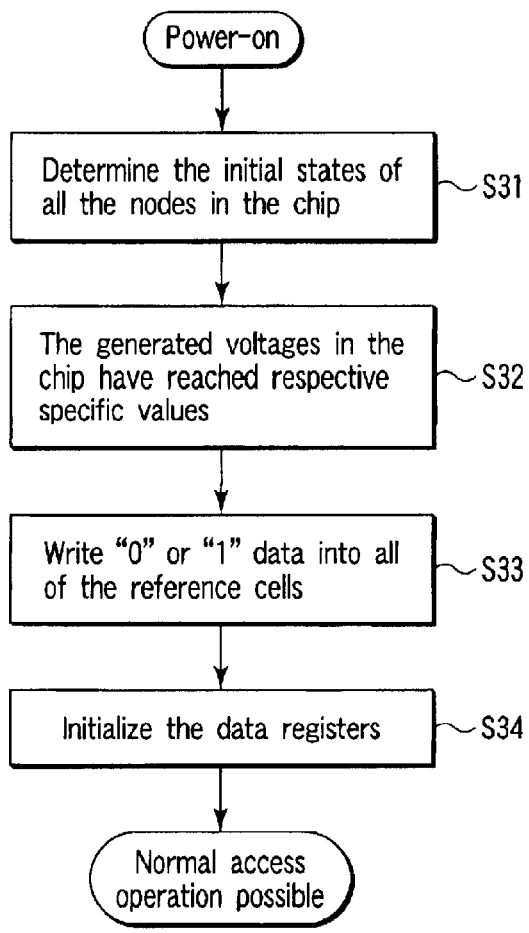
F I G. 12

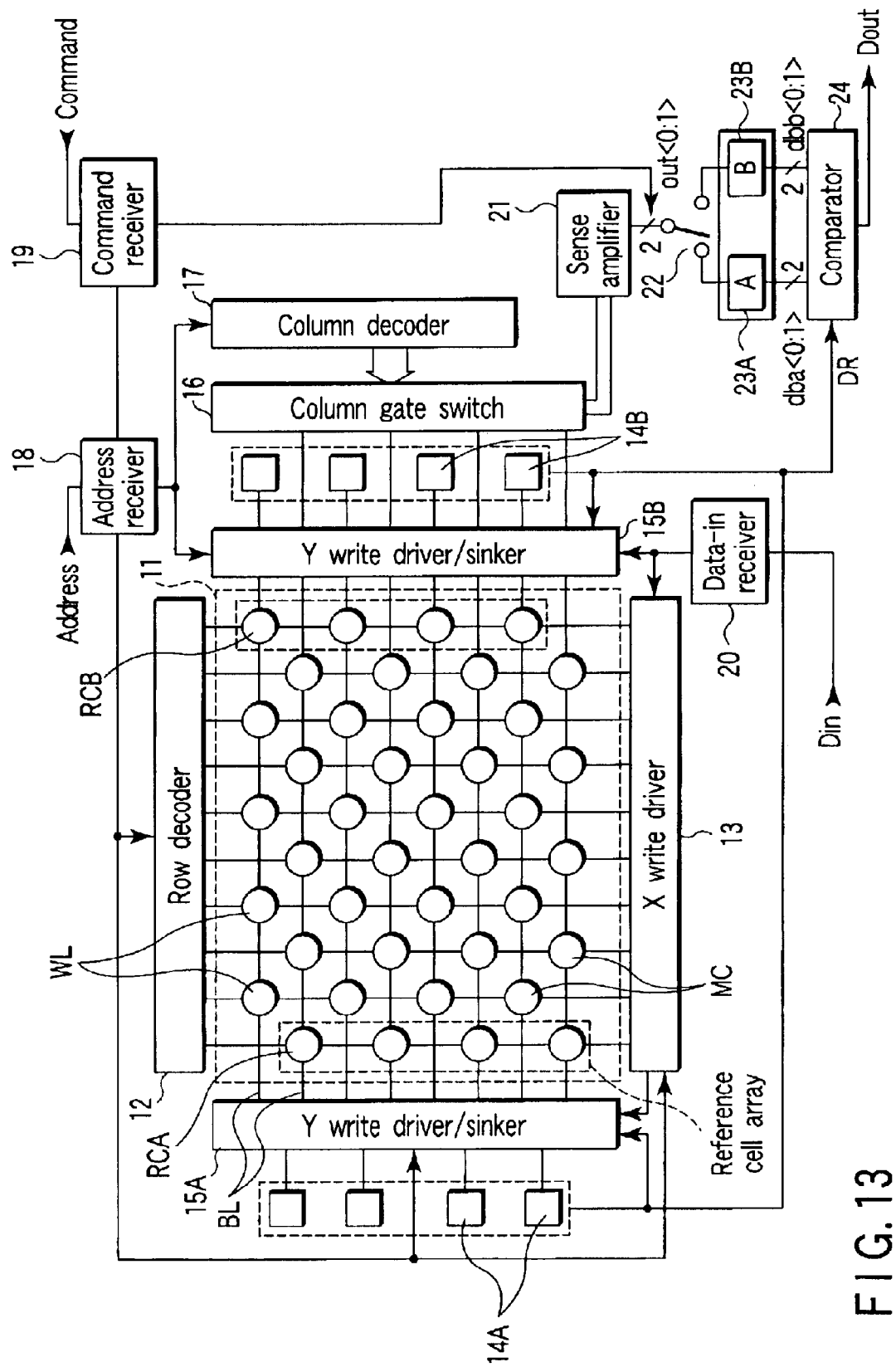
F I G. 13

MAGNETIC RANDOM ACCESS MEMORY AND READING METHOD THEREOF

CROSS-REFERENCE TO RELATED APPLICATIONS

This application is based upon and claims the benefit of priority from the prior Japanese Patent Application No. 2003-38723, filed Feb. 17, 2003, the entire contents of which are incorporated herein by reference.

BACKGROUND OF THE INVENTION

1. Field of the Invention

This invention relates to a Magnetic Random Access Memory (MRAM), and more particularly to a method of reading memory information by using reference cells.

2. Description of the Related Art

An MRAM is a device that stores "1" and "0" data by making use of a magnetoresistive effect. It has been developed as one of the promising universal memory devices featuring nonvolatility, high integration, high reliability, low power consumption, and high-speed operation.

As for the magnetoresistive effect, the following two are chiefly known: GMR (Giant Magneto Resistance) and TMR (Tunneling Magneto Resistance). Of these, GMT makes use of the fact that the resistance of a conductor sandwiched between two ferromagnetic layers varies with the directions of the spins in the upper and lower ferromagnetic layers. However, the MR ratio representing the rate of a change in the magnetic resistance is as low as about 10%. Therefore, in an MRAM using GMR, a stored-data read signal is so small that it is difficult to secure a read margin. For this reason, the MRAM has been considered to be unsuitable for practical applications.

On the other hand, TMR, which has a stacked structure composed of an insulating film sandwiched between two metals acting as ferromagnetic layers, makes use of a change in the magnetoresistance caused by the spin polarization tunnel effect. Specifically, when the directions of the spins in the upper and lower layers are parallel with each other, the tunnel probability between the two magnetic layers with the tunnel insulating film between them becomes maximum, with the result that the resistance becomes minimum. With the directions of the spins being nonparallel with each other, when the spin polarization tunnel probability becomes minimum, the resistance becomes maximum. To realize two such spin states, one of the two magnetic layers is normally fixed in the direction of its magnetization and is set so as not to be influenced by external magnetization. Generally, the layer whose magnetization is fixed in direction is called a pin layer. The other magnetic layer enables the direction of magnetization to be programmed so as to be parallel or nonparallel with the pin layer, depending on the direction of the applied magnetic field. This layer, which is generally called a free layer, has the function of storing information. In TMR, the MR ratio as the resistance change rate has exceeded 50%. Thus, TMR is becoming dominant in the development of MRAMs.

When an MRAM using TMR is written into, the direction of magnetization in the free layer is reversed. To do this, current larger than a specific value is caused to flow through a bit line and a word line passing through each memory in such a manner that they cross at right angles with each other. The magnitude of the resultant magnetic field generated by the current controls the direction of the magnetization in the free layer.

On the other hand, methods of reading the stored data from a memory cell includes a method of applying a voltage between the two magnetic layers of the TMR corresponding to the selected bit and reading the resistance from the current flowing through them and a method of causing a constant current through the selected TMR and reading the voltage generated between the two magnetic layers by the current.

Specifically, a self-reference reading method (or destructive reading method) has been proposed (as disclosed in U.S. Pat. No. 6,134,138). In this patent reference 1, an example of an MRAM using GMR has been described. The same reading method can be applied to TMR. This method enables the largest reading signal to be secured between "1" data items or "0" data items and therefore is a very effective method for securing a reading margin.

FIG. 14 is a flowchart for the conventional self-reference reading method. Although FIG. 14 shows only the sequence of reading one bit of data, any number of bits of data requested by the system are read in an actual memory. In the read sequence, a word line and a bit line are activated suitably, thereby reading the resistance of the selected cell. The result of the reading is held in a data buffer A (first reading) (S1). Then, data "1" is written into, for example, the selected cell (first writing) (S2). Thereafter, the resistance of the selected cell is read again. The information is held in a data buffer B (second reading) (S3). In this state, it is determined whether the value of the data buffer A is equal to that of the data buffer B (S4). By making use of the fact that data "1" has been written in the first write operation, when the value of the data buffer A is equal to that of the data buffer B, it is determined that the data read from the selected cell is "1" (S5). When the value of the data buffer A differs from that of the data buffer B, it is determined that the data read from the selected cell is "0" (S6).

In the sequence of FIG. 14, data "1" is always written in the selected cell, regardless of the stored information before the reading. That is, the data before the reading may have been destroyed. This is why it is called a destructive reading method. When it is determined that the data read from the selected cell is "0", the data in the selected cell has been rewritten from "0" to "1" in the first write operation. Therefore, it is necessary to write data "0" into the selected cell (second writing) (S7).

As described above, the self-reference reading method, or the destructive reading method, requires two read operations and two write operations at worst, that is, a total of four cycles, which makes high-speed access difficult. Furthermore, in the MRAM, the drawn current in a write operation is generally larger than in a read operation. As a result, two write operations in a read operation cause the power consumption of the chip itself to increase further, which makes it difficult to introduce MRAMs into the market for small portable information terminals and the like.

BRIEF SUMMARY OF THE INVENTION

According to an aspect of the present invention, there is provided a magnetic random access memory device comprising: a memory cell array in which a plurality of memory cells producing a magnetoresistive effect are arranged in a matrix; a plurality of reference cells which are provided in a part of the memory cell array and store data to be referred to when the memory cells are read from; word lines arranged in each row of the memory cell array; bit lines arranged in each column of the memory cell array; a row decoder to selectively drive the word lines; a column decoder to select the bit lines; a sense amplifier to sense the data in the selected memory cell and the data in the selected reference cell; a first data buffer to hold the data outputted from the sense amplifier; a controller which reads the data from the selected memory cell and then inverts the data in the selected reference cell; a second data buffer to hold the data outputted from the sense amplifier according to the data in the selected memory cell and the inverted data in the reference cell; and a comparator to compare the output data of the first data buffer and that of the second data buffer and determine the data read from the selected cell.

According to another aspect of the present invention, there is provided a magnetic random access memory device comprising: word lines arranged in each row of a memory cell array; bit lines arranged in each column of the memory cell array; a row decoder to selectively drive the word lines; a column decoder to select the bit lines; a plurality of memory cells producing a magnetoresistive effect which are arranged at half of the intersections of the word lines and the bit lines; a plurality of reference cells which are provided in a part of the memory cell array, are selected by dedicated word lines, and store data to be referred to when the memory cells are read from; a sense amplifier to sense the data in the selected memory cell and the data in the selected reference cell; a first data buffer to hold the data outputted from the sense amplifier; a controller which reads the data from the selected memory cell and then inverts the data in the selected reference cell; a second data buffer to hold the data outputted from the sense amplifier according to the data in the selected memory cell and the inverted data in the reference cell; and a comparator to compare the output data of the first data buffer and that of the second data buffer and determine the data read from the selected cell.

According to a further aspect of the present invention, there is provided a magnetic random access memory reading method comprising: sensing the difference between the data read from a selected cell and the data read from a reference cell in a first read operation; writing the reverse of the data read from the selected cell in the first read operation into the reference cell; sensing the difference between the data read from the selected cell and the data read from the reference cell in a second read operation; and determining the data stored in the selected cell from whether the difference between the data sensed in the first read operation is larger or smaller than the difference between the data sensed in the second read operation.

BRIEF DESCRIPTION OF THE SEVERAL VIEWS OF THE DRAWING

FIG. 8 is a circuit diagram of an example of the comparator in FIG. 2;

FIG. 9 is a table to help explain the operation of the comparator;

FIG. 10 is a circuit diagram of an example of the control circuit in FIG. 2;

FIG. 11 is a waveform diagram to help explain the operation of the control circuit in FIG. 10;

FIG. 12 is a flowchart to help explain the operation when the power is turned on;

FIG. 13 shows the configuration of a second embodiment of the present invention.

DETAILED DESCRIPTION OF THE INVENTION

Hereinafter, referring to the accompanying drawings, embodiments of the present invention will be explained.

(Basic Principle)

Figure 1:
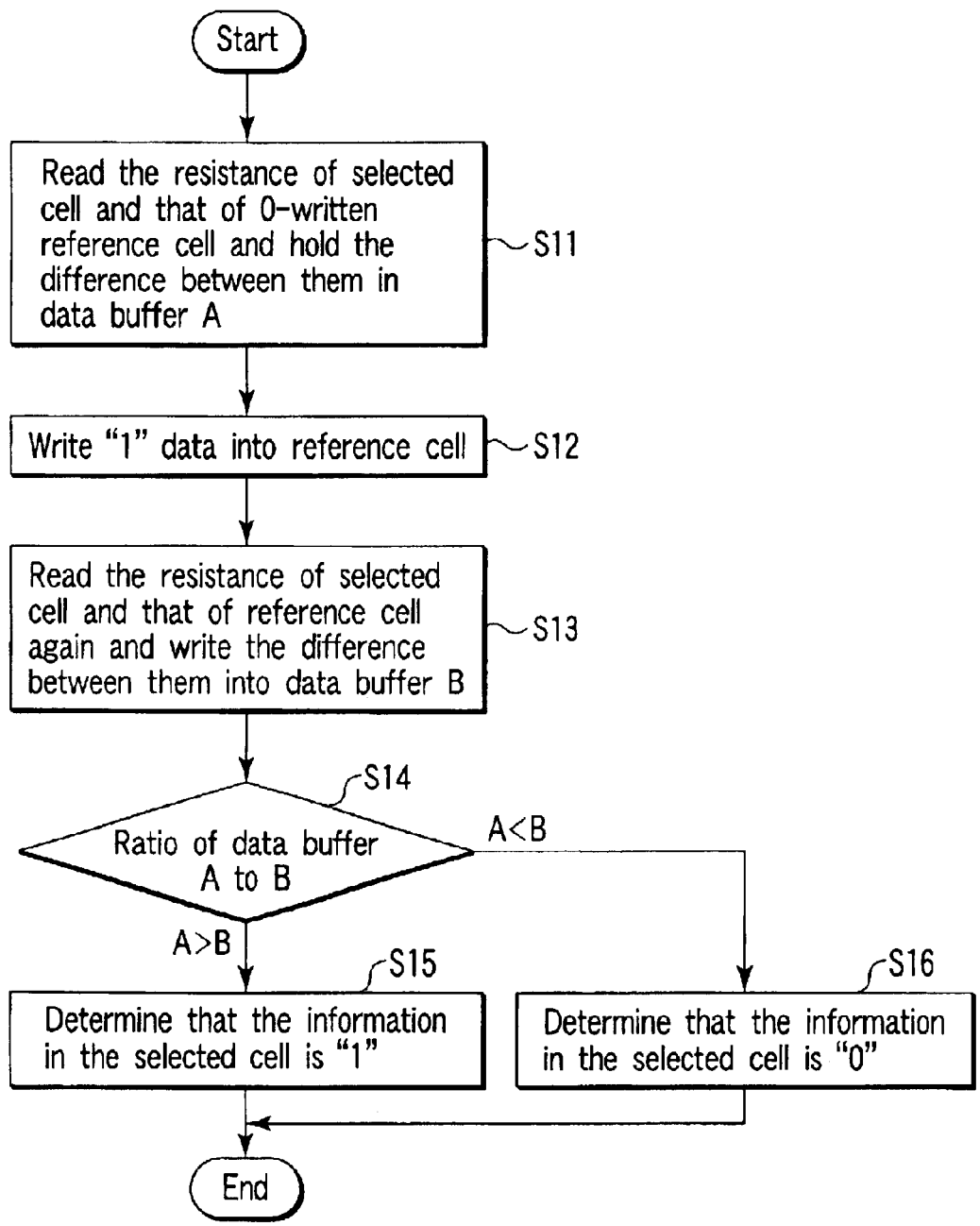
FIG. 1 is a flowchart to help explain the basic principle of the present invention.

FIG. 1 is a flowchart to help explain the basic principle of a read operation in an embodiment. First, the selected cell and a reference cell in which, for example, data "0" has been written are selected at the same time and the difference in resistance between the two cells is held in a data buffer A (first reading) (S11). Next, the reverse of the data previously written in the reference cell, such as "1," is written (first writing) (S12). Thereafter, the selected cell and the reference cell in which data "1" has been written are selected at the same time and the difference in resistance between the two cells is held in a data buffer B (second reading) (S13). In this state, the value in the data buffer A is compared with the value in the data buffer B (S14). If the result of the comparison has shown A>B, that is, if the result has shown that the difference in resistance between the selected cell and the reference cell with "0" in it is larger than the difference in resistance between the selected cell and the reference cell after "1" has been written into the reference cell, it is determined that "1" has been written in the selected cell (S15).

On the other hand, if the result of the comparison has shown A<B, that is, if the result has shown that the difference in resistance between the selected cell and the reference cell with "0" in it is smaller than the difference in resistance between the selected cell and the reference cell after "1" has been written into the reference cell, it is determined that "0" has been written in the selected cell (S16).

What is important here is that the selected cell is not written into at all in the sequence shown in FIG. 1. This means that the reading method in the embodiment is a destructive reading method. Therefore, the second write operation indispensable to conventional destructive reading is unnecessary, with the result that the read operation needing 4cycles in the conventional sequence is completed in three cycles. Suppose the time required for a read operation is equal to the time required for a write operation and the power consumption in a write operation is five times the power consumption in a read operation. Under these assumptions, use of the approach of the embodiment achieves a 25% higher-speed operation in the read time and a 42% reduction in the power consumption in a read operation.

In the embodiment, a dedicated reference cell is provided and the written information in the selected cell can be obtained from the difference in resistance between the selected cell and the reference cell before it is written into and that between the selected cell and the reference cell after it is written into, differently from the conventional self-reference destructive reading method.

On the other hand, as for a reading margin, since the data in the selected is compared with the reverse of the data in the reference cell, this is equivalent to a comparison of the largest signals corresponding to the MR (Magneto Resistive) ratio. As a result, it is possible to secure a reading margin equivalent to that for a conventional destructive read operation.

(First Embodiment)

Figure 2:
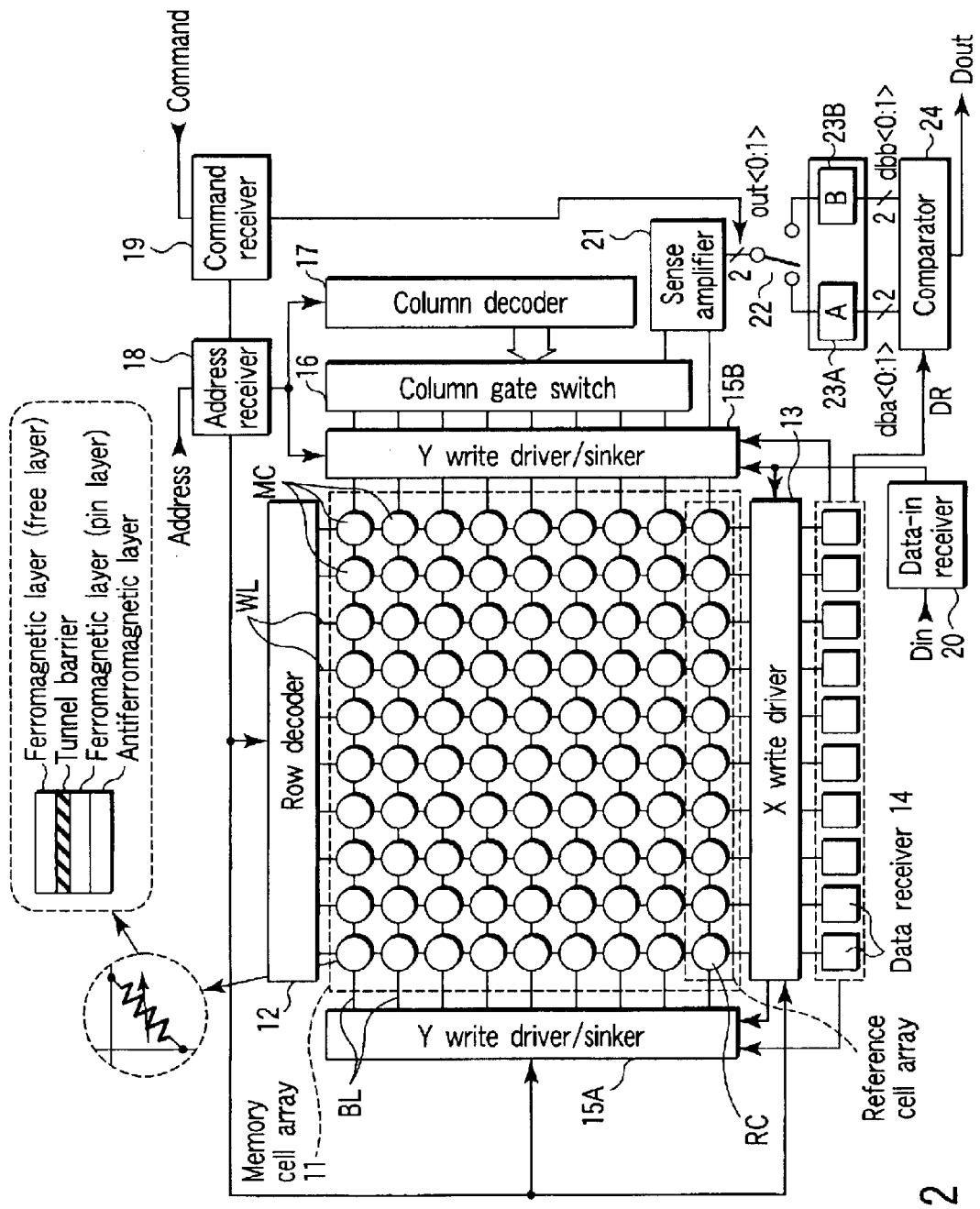
FIG. 2 shows the configuration of a first embodiment of the present invention.

FIG. 2 shows an MRAM related to a first embodiment of the present invention. A memory cell array 11 has a plurality of memory cells MC arranged in a matrix. The memory cells MC use, for example, TMR as basic elements. Each of the memory cells MC is connected to a word line WL and a bit line BL. One end of each word line WL is connected to a row decoder 12. The other end of each word line WL is connected to an X write driver 13. The X write driver 13 causes current to flow through a word line WL, thereby generating a current magnetic field in the x-axis direction.

In the memory cell array 11, a row of cells closest to, for example, the X write driver 13 are set as reference cells RC playing an important role in realizing nondestructive reading. The reference cells RC are connected to a dedicated bit line.

In the X write driver 13, there are as many reference cell data registers 14 as there are reference cells RC. The data registers 14 hold the data just written into the reference cells. Since the data in the reference cells never fails to be reversed in a read cycle as described later, the data registers 14 are needed to clarify the states the present written data in the reference cells are in.

If there is no reference cell data register, when another memory cell is read from using the same reference cell, the information to be written into the reference cell in a first write operation becomes unclear, making the read operation impossible. The data registers can be eliminated by writing data "0" or the initial state into the reference cells each time at the beginning of a read cycle. In this case, however, two write operations are always needed, which impairs the merit of being faster and consuming less power than conventional destructive reading. In contrast, use of data registers makes it possible to reduce the number of write operations and realize a higher-speed operation and less power consumption. The data held in the data registers 14 is reversed at the end of each read operation.

On the other hand, one end of each bit line BL is connected to a Y write driver/sinker 15A. The other end of each bit line BL is connected to a Y write driver/sinker 15B. The Y write driver/sinkers 15A, 15B cause current to flow through the corresponding bit line BL, thereby generating a current magnetic field in the Y-axis direction. The reason why the Y driver/sinkers 15A, 15B are provided at both ends of each bit line BL is that the direction of magnetization in the free layer is controlled in either a parallel or a nonparallel direction with respect to the pin layer by making the direction of the current in the bit line variable in two directions.

The Y write driver/sinker 15B is connected to a column decoder 17 via a column gate switch 16. An address receiver 18 is connected to the Y write driver/sinker 15B, column decoder 17, row decoder 12, and X write driver 13. Receiving an address signal, the address receiver 18 supplies the signal to the row decoder 12, X write driver 13, Y write driver/sinker 15B, and column decoder 17. A command receiver 19, which receives an externally supplied command signal, supplies the signal to the address receiver 18 and a switch circuit 22. A data-in receiver 20, which receives write data Din, supplies the data to the Y write driver/sinker 15B, X write driver 13, and Y write driver/sinker 15A.

The column switch 16 selects a bit line BL connected to a memory cell MC according to the output signal of the column decoder 17. The bit line selected by the column switch 16 and the reference cell bit line connected to the reference cells RC via the Y write driver/sinker 15B are connected to the sense amplifier 21. The sense amplifier 21 senses the signals on the bit lines. The output signal of the sense amplifier is supplied to either a data buffer 23A or a data buffer 23B via the switch circuit 22 that operates according to the signal supplied from the command receiver 19. The output signals of the data buffers 23A, 23B and the output signal DR of the data register 14 are supplied to a comparator 24. The comparator 24 determines the signals of the data buffers 23A, 23B according to the output signal of the data register 14 and outputs the final output data.

Figure 3:
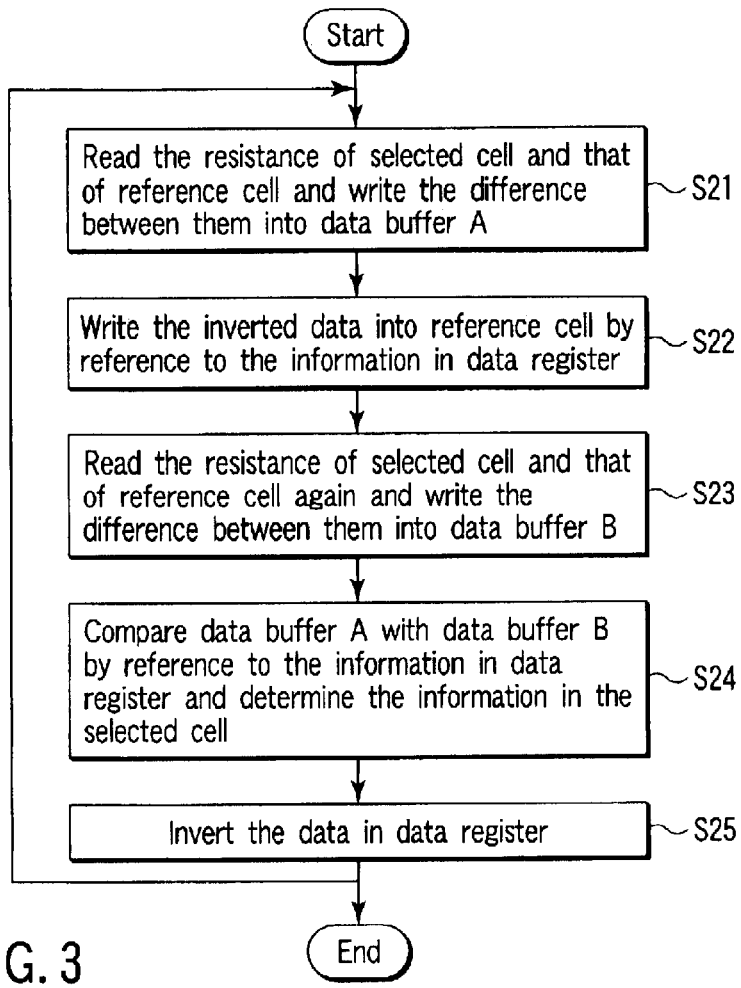
FIG. 3 is a flowchart to help explain the operation of the first embodiment in FIG. 2.

FIG. 3 is a flowchart to help explain the operation of the first embodiment of FIG. 2.

When the data in a memory cell MC is read, one word line selected by the row decoder 12 is activated, with the result that cell information (signal current or signal voltage caused by the TMR resistance) appears on all the bit lines. Thereafter, the column decoder 17 selectively makes a column gate switch 16 conduct. As a result, one selected bit and the reference cell bit line are connected to the sense amplifier 21. In this state, the signals corresponding to the selected cell and reference cell are supplied to the sense amplifier 21. The sense amplifier 21 senses the difference between the signals and supplies the result of the sensing to the data buffer 23A via the switch circuit 22. As a result, the difference in resistance between the selected cell and the reference cell is held in the data buffer 23A (S21).

Thereafter, referring to the data stored in the data register 14, the data in the reference cell RC is reversed (S22). Specifically, currents of suitable magnitudes in suitable direction are caused to flow through the selected word line and the bit line for the reference cell RC, thereby generating a resultant magnetic field large enough to reverse the direction of the magnetic domain in the free layer of the reference cell RC, which reverses the data only in the reference cell RC connected to the selected word line. At this time, only the reference cell connected to the selected word line is reversed according to the data held in the data register 14. In the initial state, for example, data "0" is held in the data register 14 and data "0" is written in the reference cell RC according to the data in the data register 14. For this reason, the data in the reference cell is reversed to data "1" with respect to data "0" in the data register 14. In writing the reversed data, the X write driver 13 drives the word line according to the data in the data register 14.

Next, the resistance of the selected cell and that of the reference cell are read, as described above, again. The sense amplifier 21 senses the difference between the resistances. The sense output signal is supplied to the data buffer 23B via the switch circuit 22. The difference in resistance between the selected cell and the reference cell is held in the data buffer 23B (S23).

Next, the data in the data buffer 23A and the data in the data buffer 23B is supplied to the comparator 24. On the basis of the data supplied from the data register 14, the comparator 24 compares the data in the data buffer 23A with the data in the data buffer 23B and determines the data read from the selected cell (S24). The output signal Dout of the comparator 24 is outputted outside the chip. Thereafter, the data in the data register 14 corresponding to the selected cell is reversed (S25).

An explanation has been given, centering on the read operation. Since the operation of writing the data is the same as a general write operation in an MRAM, an explanation will be omitted.

Figure 4:
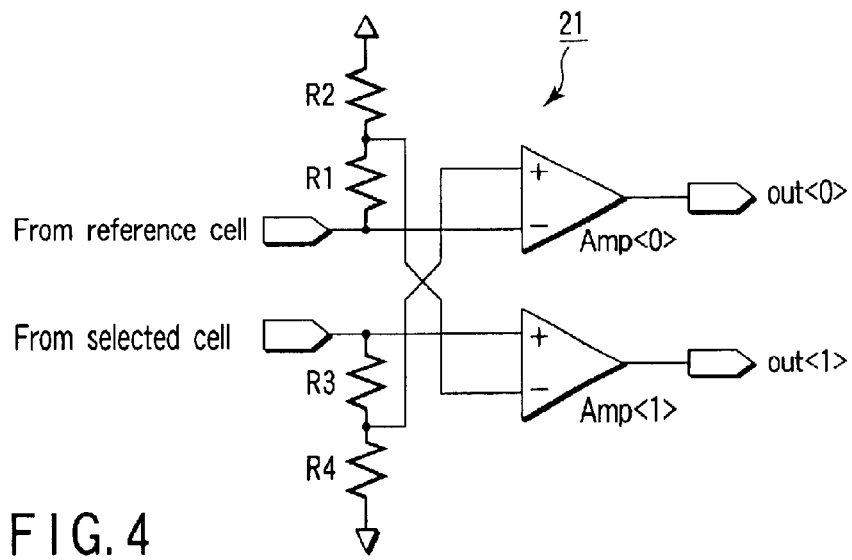
FIG. 4 is a circuit diagram of an example of the sense amplifier in FIG. 2.

FIG. 4 shows an example of the sense amplifier 21. In the first embodiment, the information from the reference cell and that from the selected cell is supplied to the inverting input terminals of two differential amplifiers Amp<0>, Amp<1> connected in parallel, respectively. The differential amplifiers Amp<0>, Amp<1> output the pieces of the information in the form of two output signals. Between the inverting input terminal of the differential amplifier Amp<0> and a power supply, resistances R1, R2 are connected in series. Between the noninverting input terminal of the differential amplifier Amp<1> and the power supply, resistances R3, R4 are connected in series. The junction node of the resistances R1, R2 is connected to the inverting input terminal of Amp<1>. The junction node of the resistances R3, R4 is connected to the noninverting input terminal of Amp<0>. That is, the signals to the input terminals of the differential amplifiers Amp<0>, Amp<1> are converted suitably by the resistances R1 to R4 into voltages. With such a configuration, a specific dead zone can be set in the sense amplifier 21.

Figure 5:
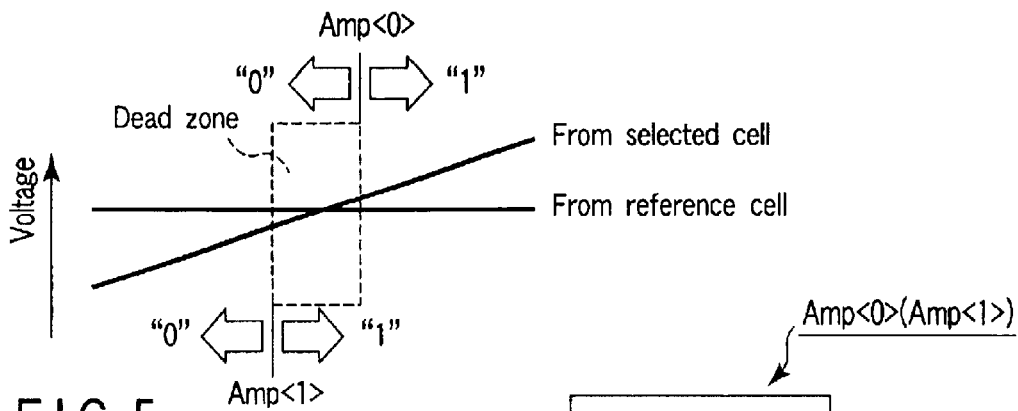
FIG. 5 is a diagram to help explain the operation of the sense amplifier in FIG. 4.

FIG. 5 shows the dead zone set in the sense amplifier 21. When there is almost no difference between the signal from the reference cell and that from the selected cell, the output signal out<0> of the differential amplifier Amp<0> is "0" and the output signal out<1> of the differential amplifier Amp<1> is "1". Setting the dead zone this way makes it possible to sense ternary states <0,0> <0,1> <1,1>.

The width of the dead zone can be controlled by changing the resistance ratio of R1:R2 and the resistance ratio of R3:R4. However, with a higher resistance ratio, only when the difference in resistance between the reference cell and the selected cell is sufficient, the read margin is decreased. For this reason, setting is generally done so as to meet the expressions: R1/R2<1 and R3/R4<1.

Figure 6:
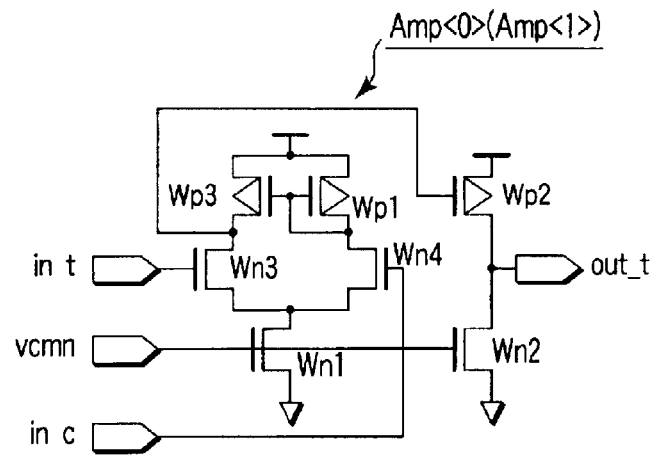
FIG. 6 is a circuit diagram of an example of the differential amplifier in FIG. 4.

FIG. 6 shows an example of the differential amplifier of FIG. 4. This differential amplifier can be realized by an ordinary operational amplifier. The differential amplifier comprises n-channel MOS transistors (hereinafter, referred to as NMOSs) Wn1 to Wn4, p-channel MOS transistors (hereinafter, referred to PMOSs) Wp1 to Wp3. An input signal vcmn has a sufficient intermediate potential to perform constant current control of the n-channel MOS transistor Wn1. The input signal vcmn contributes to the stable operation of a current mirror circuit. Input signals in_t, in_c are supplied to the gates of the NMOSs Wn3, Wn4 constituting a differential pair. The output signal of the PMOSs Wp1, Wp3 constituting the current mirror circuit is supplied to the gate of the PMOS Wp2 constituting an inverter circuit. The inverter circuit is composed of the PMOS Wp2 and the NMOS Wn2 serving as a constant current load. The output signal out_t is outputted at the junction node of the PMOS Wp2 and the NMOS Wn2.

Figure 7:
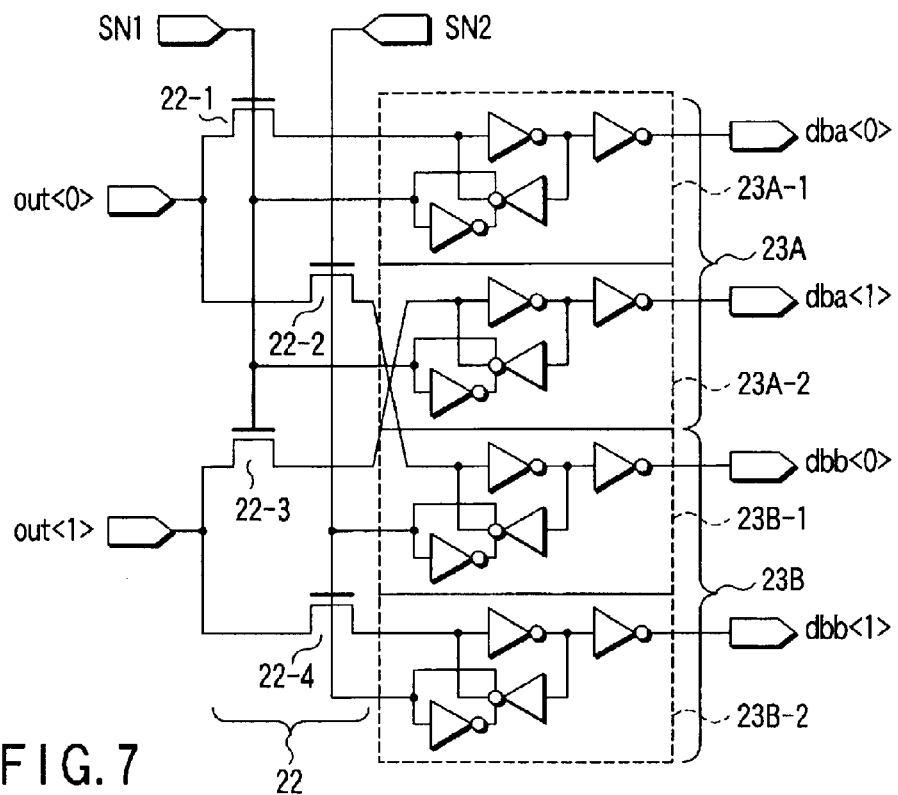
FIG. 7 is a circuit diagram of an example of the data buffer in FIG. 2.
Figure 14:
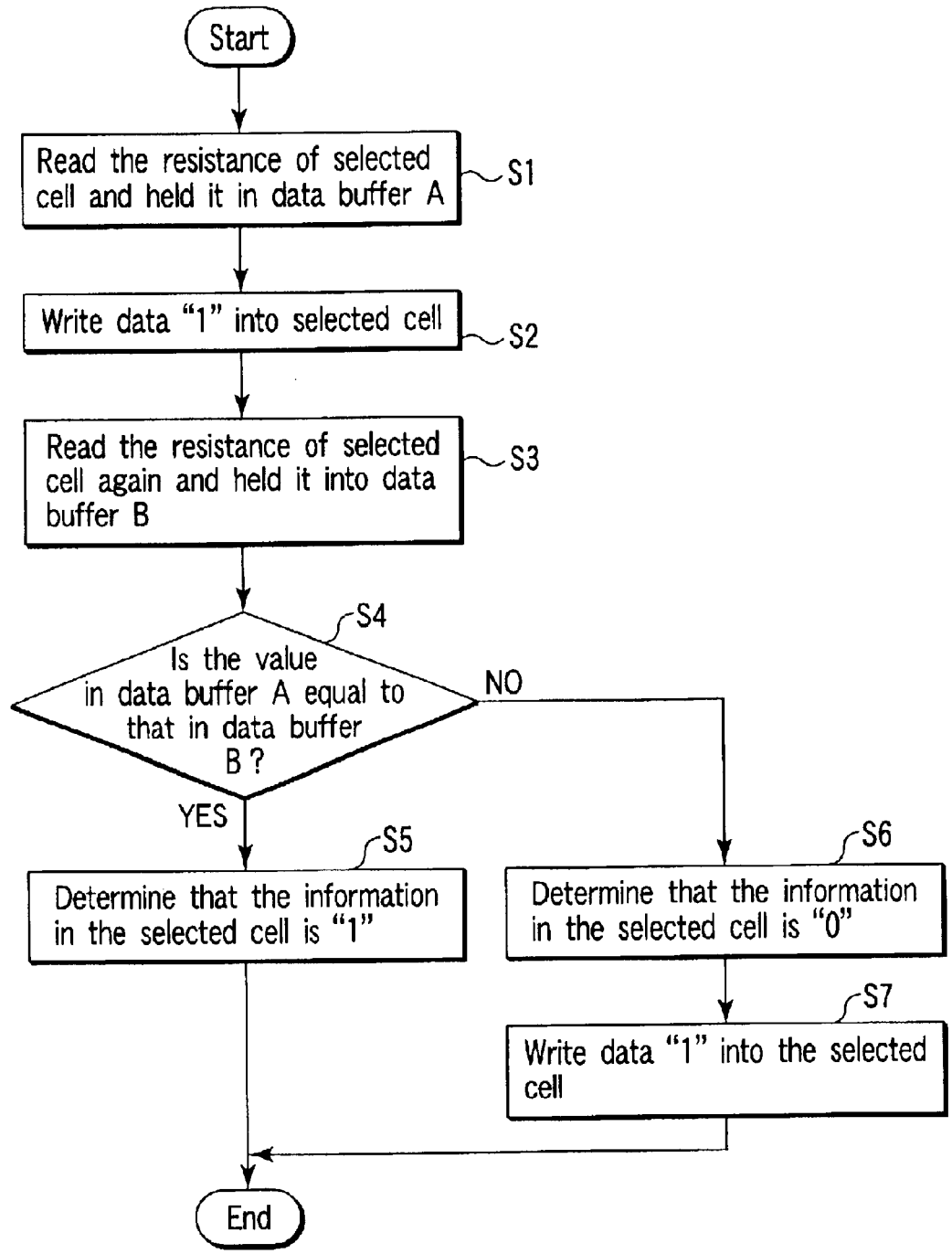
FIG. 14 is a flowchart to help explain a conventional destructive reading method.

FIG. 7 shows an example of the switch circuit 22 and the data buffers 23A, 23B. The switch circuit 22 is composed of NMOSs 22-1, 22-2, 22-3, 22-4. The NMOSs 22-1, 22-3 are controlled by a control signal SN1 supplied from the command receiver 19. The NMOSs 22-2, 22-4 are controlled by a control signal SN2 supplied from the command receiver 19. The data buffer 23A is composed of latch circuits 23A-1, 23A-2. The data buffer 23B is composed of latch circuits 23B-1, 23B-2.

When the control signal SN1 is made high in a first read operation, the NMOSs S22-1, 22-3 are turned on. As a result, the signals OUT<0>, OUT<1> outputted from the sense amplifier 21 are held in the latch circuits 23A-1, 23A-2, respectively. When the control signal SN2 is made high in a second read operation, the NMOSs S22-2, 22-4 are turned on. As a result, the signals OUT<0>, OUT<1> outputted from the sense amplifier 21 are held in the latch circuits 23B-1, 23B-2, respectively.

FIG. 8 shows an example of the comparator 24. The comparator 24 is composed of first to fourth logic circuits 24-1 to 24-4, NMOSs 24-5 to 24-8 controlled by the output signals of the first to fourth logic circuits 24-1 to 24-4, and an inverter circuit 24-9. Between an input node N1 to which the output signal DR of the data register 14 is supplied and an output node N2, the NMOSs 24-5, 24-7 are connected in series. A series circuit of an inverter circuit 24-9 and NMOSs 24-6, 24-8 is connected in parallel with the series circuit of the NMOSs 24-5, 24-7. The signals dba<0><1> outputted from the latch circuits 23A-1, 23A-2 of the data buffer 23 are supplied to the logic circuits 24-1, 24-2, respectively. The signals dbb<0><1> outputted from the latch circuits 23B-1, 23B-2 of the data buffer 23 are supplied to the logic circuits 24-1, 24-2, respectively.

FIG. 9 is a truth table showing the relationship between the output data of the sense amplifier 21 of FIG. 4 and the output data Dout of the comparator 24. The operation of the comparator 24 of FIG. 8 will be explained by reference to FIG. 9.

As described in the sequence of FIG. 3, in a case where the initial write data to the reference cell is "0" (that is, where the initial data in the reference cell of FIG. 7 is "0"), when a first read operation is carried out, data <0, 1> or data <1, 1> is latched in the latch circuits 23A-1, 23A-2 of the data buffer 23A. If the latched data is <0, 1>, the difference in signal between the reference cell and the selected cell is small, as shown in FIG. 5. Next, after data "1" is written into the reference cell, when a second read operation is carried out, data <0, 0> is latched in the latch circuits 23B-1, 23B-2 of the data buffer 23B.

The output signals dba<0><1> of the latch circuits 23A-1, 23A-2 are <0, 1> as described above. The output signals dbb<0><1> of the latch circuits 23B-1, 23B-2 are <0, 0> as described above. When these output signals are supplied to the comparator 24, the output signals of the logic circuits 24-1, 24-3 go high and the output signals of the logic circuits 24-2, 24-4 go low. As a result, the NMOSs 24-5, 24-7 turn on and the NMOSs 24-6, 24-8 turn off. At this time, the output signal of the data register 14 is the initial read data "0" in the reference cell. The data "0" is outputted as output data at the output node N2 via the NMOSs 24-5, 24-7. Therefore, the final output data is "0." As a result, it is determined that "0" has been written in the selected cell.

On the other hand, when data <1, 1> is held in the latch circuits 23A-1, 23A-2 of the data buffer 23A in the first read operation, this means that the voltage (or the resistance) of the selected cell is higher than that of the reference cell. Next, after data "1" is written into the reference cell, when the second operation is carried out, data <0, 1> meaning a dead zone is latched in the latch circuits 23B-1, 23B-2 of the data buffer 23B.

The output signals dba<0><1> of the latch circuits 23A-1, 23A-2 are <1, 1> as described above. The output signals dbb<0><1> of the latch circuits 23B-1, 23B-2 are <0, 1> as described above. When these output signals are supplied to the comparator 24, the output signals of the logic circuits 24-2, 24-4 go high and the output signals of the logic circuits 24-1, 24-3 go low. As a result, the NMOSs 24-6, 24-8 turn on and the NMOSs 24-5, 24-7 turn off. At this time, the output signal of the data register 14 is the initial read data "0" in the reference cell. The data "0" is inverted by the inverter circuit 24-9. The inverted data is outputted as output data at the output node N2 via the NMOSs 24-6, 24-8. Therefore, the final output data is "1". As a result, it is determined that "1" has been written in the selected cell.

In a second reading from the cell at the same location, or when the reference cell has been accessed once in all of the cycles, the data in the reference cell has been rewritten to "1" (that is, corresponding to a case where-the initial data in the reference cell of FIG. 7 is "1"). In this case, the final output data is shown on the right side of the truth table, which is the reverse of the contents of the right side. In this case, because the data in the data register 14 is "1", the final output data outputted from the comparator 24 is reversed whenever the data in the data register 14 is "0".

FIG. 10 shows an example of each of the data registers 14 in FIG. 2. When the power is turned on, an initial value, for example, data "0" is set in the data register 14. The data held in the data register 14 is reversed according to an MRAM read operation. Specifically, in the data register 14, an inverter circuit 14a and a clocked inverter circuit 14b constitutes a latch circuit. In response to a power-on signal PWON, an NMOS 14c turns on, bringing the node of the latch circuit to the ground potential Vss. A NOR circuit 14d and an inverter circuit 14e control the clocked inverter circuit 14b according to the power-on signal PWRON or a clock signal CLK generated when the MRAM is accessed. An inverter circuit 14f inverts the output signal of the latch circuit and supplies the output signal DR to the X write driver 13 and the comparator 24. A delay circuit (DL) 14g delays the output signal DR of the inverter circuit 14f for a specific time. A NOR circuit 14i controls an NMOS 14j according to the clock signal CLK inverted by the inverter circuit 14h and the output signal of the delay circuit 14g. The NMOS 14j controls the potential at the input terminal of the clocked inverter circuit 14b constituting the latch circuit. An inverter circuit 14k inverts the output signal of the delay circuit 14g. A NOR circuit 14l controls an NMOS 14m according to the output signal of the inverter circuit 14k and the clock signal CLK inverted by the inverter circuit 14h. The NMOS 14m controls the potential at the input terminal of the inverter 14a constituting the latch circuit.

FIG. 11 is a waveform diagram to help explain the operation of the data register 14 of FIG. 10. When the power-on signal PWRON goes high, the NMOS 14c goes on and the input terminal NB of the inverter circuit 14a goes low. As a result, the output signal of the latch circuit goes high. The output signal is inverted by the inverter circuit 14f. The inverted signal is supplied as a control signal DR to the X write driver 13 and the comparator 24. As a result, data "0" is set in the data register 14.

In this state, when a clock signal CLK is generated according to access to the MRAM, the NMOSs 14j, 14m are turned on alternately according to the output signal of the delay circuit 14g and the clock signal, thereby reversing the data in the latch circuit. As a result, the control signal DR outputted from the inverter circuit 14f is inverted, with the result that the data in the data register 14 is inverted.

FIG. 12 shows a sequence when the power of the MRAM of the present invention is turned on. When the power is turned on, the initial state of each node in the memory is determined (S31). After the various voltages generated in the chip have reached specific values (S32), "0" or "1" data is written into all of the reference cells (S33). Next, the reference cell data registers 14 are initialized in the operations shown in FIGS. 10 and 11 (S34). After such a series of processes has been completed, a normal access operation can be carried out.

The operation of writing the data into the reference cells may be carried out by incrementing the row address as part of the power-on sequence on the user side. Alternatively, an initial write counter circuit may be provided in the chip and used to increment the row address to write the data into the reference cells automatically.

According to the first embodiment, the reference cells RC to be selected at the same time with the selected cell are provided in the memory cell array 11. When the selected cell is read from, the sense amplifier 21 senses the difference between the resistance of the selected cell and that of the reference cell RC. Thereafter, the data in the reference cell RC is reversed. Furthermore, the sense amplifier 21 senses the difference between the resistance of the selected cell and the reversed one of the reference cell. The comparator 24 compares the results of the sensing from the two read operations, thereby determining the data stored in the selected cell. As described above, according to the first embodiment, since the data in the reference cell is changed and the data in the selected cell is not changed when the data is read, it is possible to prevent the destruction of the data in the selected cell, which was unavoidable in the conventional self-reference reading method. As a result, only two read operations and one write operation are required to read the data, which enables high-speed reading. In addition, the number of write operations consuming much power is smaller, which realizes a less-power-consuming MRAM.

Furthermore, the output signal DR of the data register 14 provided so as to correspond to the reference cell is also supplied to the comparator 24. On the basis of the output signal DR, the comparator 24 determines the data in the selected cell from the data held in the data buffers 23A, 23B. Consequently, in successive access operations, the comparator 24 can determine the data in the selected cell reliably from the data held in the data buffers 23A, 23B.

(Second Embodiment)

FIG. 13 is a block diagram of an MRAM according to a second embodiment of the present invention. In FIG. 13, the same parts as those in FIG. 2 are indicated by the same reference numerals. The second embodiment differs from the first embodiment in the configuration of the memory cell array using TMR. Specifically, in the memory cell array 11 of the first embodiment, memory cells MC and reference cells RC are placed at the intersections of all the word lines WL and bit lines BL. A bit line exclusively used by the reference cells RC is provided close to the X write driver 13 of the memory cell array 11.

In contrast, in the second embodiment, memory cells MC and reference cells RC are arranged at half of the intersections of the word lines WL and bit lines BL as shown in FIG. 13. The reference cells RCA, RCB are arranged in the row direction. Word lines WL exclusively used by reference cells RC are provided on both sides of the memory cell array 11 in such a manner that they are close to the Y write driver/sinkers 15A, 15B.

The memory cells MC and reference cells RC are composed of TMR. One end of each word line WL is connected to the row decoder 12. The other end of each word line WL is connected to the X write driver 13. The word lines WL are selected by the row decoder 13. Current is caused to flow through the word line selected by the X write driver 13, thereby generating a current magnetic field in the X-axis direction.

One end of each bit line BL is connected to the Y write driver/sinker 15A. The other end of each bit line BL is connected to the Y write driver/sinker 15B. The Y write driver/sinkers 15A, 15B cause current to flow through the bit line BL, thereby generating a current magnetic field in the Y-axis direction. A plurality of data registers 14A corresponding to the reference cells RCA are connected to the Y write driver/sinker 15A. A plurality of data registers 14B corresponding to the reference cells RCB are connected to the Y write driver/sinker 15B. As in the first embodiment, initial data is set in the data registers 14A, 14B when the power is turned on. The data in the data registers 14A, 14B are reversed at the end of each read operation. The two input terminals of the sense amplifier 21 are connected to the column gate switch 16.

With the above configuration, when a word line is selected to read the data from a memory cell CM, one of the two reference cell word lines is activated. Specifically, one of the reference cell word lines is activated so that the reference cell connected to the bit line adjacent to the bit line to which the selected cell is connected may be selected. As a result, the data (the signal current or signal voltage caused by the TMR resistance) in the selected cell and the data in the reference cell appear on all the bit lines. Thereafter, the column decoder 17 selects a column gate switch 16 and makes the switch conduct. Then, the data in one selected cell and the data in one reference cell are supplied to the sense amplifier 21. The reading operation from this point on is the same as that in the first embodiment and proceeds as shown in the sequence of FIG. 3.

While the reference cell data registers 14A, 14B are arranged on both sides of the memory cell array 11, the present invention is not limited to this. For instance, they may be provided only on one side of the memory cell array 11.

As described above, the second embodiment produces the same effect as that of the first embodiment.

The first and second embodiments have shown the case where one bit of data is read from the same cell array. When more than one bit of data is read, this can be dealt with by providing a plurality of reference cell bit lines and a plurality of sense amplifiers.

It goes without saying that this invention may be practiced or embodied in still other ways without departing from the spirit or essential character thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory device comprising:
   a memory cell array in which a plurality of memory cells producing a magnetoresistive effect are arranged in a matrix;
   a plurality of reference cells which are provided in a part of the memory cell array and store data to be referred to when the memory cells are read from;
   word lines arranged in each row of the memory cell array;
   bit lines arranged in each column of the memory cell array;
   a row decoder to selectively drive the word lines;
   a column decoder to select the bit lines;
   a sense amplifier to sense the data in the selected memory cell and the data in the selected reference cell;
   a first data buffer to hold the data outputted from the sense amplifier;
   a controller which reads the data from the selected memory cell and then inverts the data in the selected reference cell;
   a second data buffer to hold the data outputted from the sense amplifier according to the data in the selected memory cell and the inverted data in the reference cell; and
   a comparator to compare the output data of the first data buffer and that of the second data buffer and determine the data read from the selected cell.

2. The magnetic random access memory device according to claim 1, wherein
   the memory cells are arranged at all of the intersections of the word lines and the bit lines, and
   said plurality of reference cells are arranged to a dedicated bit line.

3. The magnetic random access memory device according to claim 1, wherein
   the memory cells are arranged at half of the intersections of the word lines and the bit lines, and
   the reference cells are connected to at least two dedicated word lines.

4. The magnetic random access memory device according to claim 1, further comprising:
   a plurality of data registers which are arranged so as to correspond to said plurality of reference cells and hold data to rewrite the data in the reference cells.

5. The magnetic random access memory device according to claim 4, wherein
   the data registers rewrite the data held therein for each read cycle in the selected cell.

6. The magnetic random access memory device according to claim 4, wherein
   said plurality of reference cells and the data registers are set to initial data when a power is turned on.

7. The magnetic random access memory device according to claim 6, wherein
   each of the data register includes:
     a latch circuit having a first and a second junction node, and
     a transistor having one end connected to the first junction node of the latch circuit and which sets initial data in the latch circuit when the power is turned on, and
   a control circuit includes:
     a delay circuit connected to the second junction node of the latch circuit, and
     a logic circuit to control potentials at the first and second junction nodes of the latch circuit according to a clock signal and the output signal of the delay circuit.

8. The magnetic random access memory device according to claim 1, wherein
   the sense amplifier outputs the difference between the signal read from the selected memory cell and that read from the reference cell.

9. The magnetic random access memory device according to claim 1, wherein
   the sense amplifier outputs ternary data.

10. The magnetic random access memory device according to claim 8, wherein
    the sense amplifier sets a dead zone to output ternary data.

11. The magnetic random access memory device according to claim 10, wherein
the sense amplifier includes:
a first differential amplifier which has a first and a second input terminal, with the signal from the selected reference cell being supplied to the second input terminal,
a first and a second resistor connected in series between the first input terminal and a power supply,
a second differential amplifier which has a third and a fourth input terminal, with the signal from the selected memory cell being supplied to the third input terminal, and the fourth input terminal of the second differential amplifier being connected to the junction node of the first and second resistances, and
a third and a fourth resistor connected in series between the third input terminal and the power supply, with the junction node of the third and fourth resistors being connected to the first input terminal of the first amplifier.

12. A magnetic random access memory device comprising:
word lines arranged in each row of a memory cell array;
bit lines arranged in each column of the memory cell array;
a row decoder to selectively drive the word lines;
a column decoder to select the bit lines;
a plurality of memory cells producing a magnetoresistive effect which are arranged at half of the intersections of the word lines and the bit lines;
a plurality of reference cells which are provided in a part of the memory cell array, are selected by dedicated word lines, and store data to be referred to when the memory cells are read from;
a sense amplifier to sense the data in the selected memory cell and the data in the selected reference cell;
a first data buffer to hold the data outputted from the sense amplifier;
a controller which reads the data from the selected memory cell and then inverts the data in the selected reference cell;
a second data buffer to hold the data outputted from the sense amplifier according to the data in the selected memory cell and the inverted data in the reference cell; and
a comparator to compare the output data of the first data buffer and that of the second data buffer and determine the data read from the selected cell.

13. The magnetic random access memory device according to claim 12, further comprising:
a plurality of data registers which are arranged so as to correspond to said plurality of reference cells and hold data to rewrite the data in the reference cells.

14. The magnetic random access memory device according to claim 13, wherein
the data registers rewrite the data held therein for each read cycle in the selected cell.

15. The magnetic random access memory device according to claim 13, wherein
said plurality of reference cells and the data registers are set to initial data when a power is turned on.

16. The magnetic random access memory device according to claim 15, wherein
each data register includes:
a latch circuit having a first and a second junction node, and
a transistor having one end connected to the first junction node of the latch circuit and which sets initial data in the latch circuit when the power is turned on, and
a control circuit includes:
a delay circuit connected to the second junction node of the latch circuit, and
a logic circuit to control potentials at the first and second junction nodes of the latch circuit according to a clock signal and the output signal of the delay circuit.

17. The magnetic random access memory device according to claim 12, wherein
the sense amplifier outputs the difference between the signal read from the selected memory cell and that read from the reference cell.

18. The magnetic random access memory device according to claim 12, wherein
the sense amplifier outputs ternary data.

19. The magnetic random access memory device according to claim 18, wherein
the sense amplifier sets a dead zone to output ternary data.

20. The magnetic random access memory device according to claim 19, wherein
the sense amplifier includes:
a first differential amplifier which has a first and a second input terminal, with the signal from the selected reference cell being supplied to the second input terminal,
a first and a second resistor connected in series between the first input terminal and a power supply,
a second differential amplifier which has a third and a fourth input terminal, with the signal from the selected memory cell being supplied to the third input terminal, and the fourth input terminal of the second differential amplifier being connected to the junction node of the first and second resistances, and
a third and a fourth resistor connected in series between the third input terminal and the power supply, with the junction node of the third and fourth resistors being connected to the first input terminal of the first amplifier.

21. A magnetic random access memory reading method comprising:
sensing the difference between the data read from a selected cell and the data read from a reference cell in a first read operation;
writing the reverse of the data read from the selected cell in the first read operation into the reference cell;
sensing the difference between the data read from the selected cell and the data read from the reference cell in a second read operation; and
determining the data stored in the selected cell from whether the difference between the data sensed in the first operation is larger or smaller than the difference between the data sensed in the second read operation.

22. The magnetic random access memory reading method according to claim 19, wherein the data in the reference cell is set to an initial value when the power is turned on.

* * * * *